(12) United States Patent
Ranish et al.

(10) Patent No.: US 7,547,633 B2
(45) Date of Patent: Jun. 16, 2009

(54) UV ASSISTED THERMAL PROCESSING

(75) Inventors: Joseph Michael Ranish, San Jose, CA (US); Yoshitaka Yokota, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 464 days.

(21) Appl. No.: 11/414,869

(22) Filed: May 1, 2006

(65) Prior Publication Data

US 2008/0067416 A1    Mar. 20, 2008

(51) Int. Cl.
H01L 21/31 (2006.01)
(52) U.S. Cl. ........................ 438/687; 438/677
(58) Field of Classification Search .............. 438/687, 438/677, 778, 786, 796; 427/582, 583
See application file for complete search history.

(56) References Cited

U.S. PATENT DOCUMENTS

| | | | |
|---|---|---|---|
| 4,588,610 A | | 5/1986 | Yamazaki |
| 5,112,647 A | * | 5/1992 | Takabayashi ............... 427/515 |
| 5,194,401 A | | 3/1993 | Adams et al. |
| 5,364,667 A | * | 11/1994 | Rhieu ........................ 427/582 |
| 6,016,383 A | | 1/2000 | Gronet et al. |
| 6,122,439 A | | 9/2000 | Gronet et al. |
| 6,130,415 A | | 10/2000 | Knoot |
| 6,215,106 B1 | | 4/2001 | Boas et al. |
| 6,280,183 B1 | | 8/2001 | Mayur et al. |
| 6,434,327 B1 | | 8/2002 | Gronet et al. |
| 6,869,892 B1 | | 3/2005 | Suzuki et al. |
| 7,125,799 B2 | * | 10/2006 | Aoyama et al. ............. 438/677 |
| 2003/0186554 A1 | | 10/2003 | Tam et al. |
| 2004/0065657 A1 | | 4/2004 | Adams et al. |
| 2004/0241991 A1 | | 12/2004 | Aoyama et al. |
| 2005/0142875 A1 | * | 6/2005 | Yoo ............................ 438/687 |
| 2005/0254804 A1 | | 11/2005 | Aderhold et al. |
| 2005/0263719 A1 | * | 12/2005 | Ohdaira et al. ........... 250/492.1 |
| 2005/0286243 A1 | | 12/2005 | Ranish et al. |
| 2006/0251827 A1 | | 11/2006 | Nowak et al. |
| 2007/0228289 A1 | | 10/2007 | Kaszuba et al. |
| 2007/0257205 A1 | | 11/2007 | Rocha-Alvarez et al. |
| 2007/0286963 A1 | | 12/2007 | Rocha-Alvarez et al. |
| 2008/0067425 A1 | | 3/2008 | Kaszuba et al. |

FOREIGN PATENT DOCUMENTS

WO     03 063220     7/2003

OTHER PUBLICATIONS

PCT International Search Report and Written Opinion dated Apr. 3, 2008 for Application No. PCT/US2007/67774.
Zhang Article, "Ultraviolet Annealing of Tantalum Oxide Films Grown by Photo-Induced Chemical Vapour Deposition." J. Phys. D: Appl. Phys. 32 (1999), pp. L91-L95.

* cited by examiner

Primary Examiner—Kiet T Nguyen
(74) Attorney, Agent, or Firm—Patterson & Sheridan (57) ABSTRACT

The present invention provides methods and apparatus for performing thermal processes to a semiconductor substrate. Thermal processing chambers of the present invention comprise two different energy sources, such as an infrared radiation source and a UV radiation source. The UV radiation source and the infrared radiation source may be used alone or in combination to supply heat, activate electronic, or create active species inside the thermal processing chamber.

20 Claims, 7 Drawing Sheets

UV ASSISTED THERMAL PROCESSING

BACKGROUND OF THE INVENTION

1. Field of the Invention

The present invention relates generally to a semiconductor processing tool and, more specifically, to a thermal processing tool with a UV radiation source.

2. Description of the Related Art

Rapid Thermal Processing, commonly referred to as 'RTP', subjects a substrate to a very brief, intense burst of heat that can go from room temperature to about 1000° C. in seconds. RTP technology is used to change the characteristics of a deposited film or crystal lattice. RTP generally includes processes such as annealing, silicidation and oxidation of a substrate surface.

Generally, an RTP chamber includes a radiant heat source or lamp, a chamber body, and a substrate support ring. The lamp is typically mounted on a top surface of the chamber body so that the energy generated by the lamp radiates upon the substrate supported by the substrate support ring with in the chamber body. A quartz window is typically disposed in the top surface of the chamber body to facilitate the transfer of energy from the lamp to the substrate. An external motor is usually used to rotate the support ring and the substrate to compensate for variations in the radiation energy generated by the lamp that could heat the substrate non-uniformly. Typically, a rapid thermal process is performed at a reduced pressure to get better uniformity.

Thermal oxidation is commonly used to grow very thin layer of oxide used as gate oxide. An oxidation process performed in a state of the art RTP chamber usually include raising the temperature in the RTP chamber high enough to break oxygen or other species used to form an oxide layer and to allow enough diffusion of oxygen or other species occur on the substrate surface. The temperature needed to break oxygen or other species is usually higher than the temperature needed to induce enough diffusion. The higher temperature required for breaking oxygen or other species increases thermal exposure, promote unwanted diffusion inside other structures.

Therefore, there is a need for an apparatus and method for performing oxidation or other rapid thermal processes without the requirement of increased chamber temperature.

SUMMARY OF THE INVENTION

The present invention provides methods and apparatus for performing rapid thermal processing of a semiconductor substrate.

One embodiment of the present invention provides an apparatus for thermal processing a substrate. The apparatus comprises a chamber and a UV radiation assembly disposed inside the chamber. The apparatus further comprising an outside radiation assembly configured to radiate energy into the chamber through a quartz window on the chamber.

Another embodiment of the present invention provides an apparatus for thermal processing a substrate. The apparatus comprises a chamber having a top window, a substrate support mounted inside the chamber, wherein the substrate support is configured to support the substrate with a processing surface facing the top window, a first energy assembly disposed outside the chamber, wherein the first energy assembly is configured to radiate energy through the top window, and a second energy assembly mounted inside the chamber above the substrate support.

Yet another embodiment of the present invention provides a method for thermal processing a substrate. The method comprises positioning the substrate in a chamber, applying a first energy source to supply heat to the chamber, and applying a second energy source to generate active species in the chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides methods and apparatus for performing thermal processing of a semiconductor substrate. Thermal processing chambers of the present invention comprise two different radiation energy sources, such as an infrared radiation source and a UV radiation source. The UV radiation source and the infrared radiation source may be used alone or in combination to supply heat, activate electronic, or create active species inside the thermal processing chamber. A plurality of processes, such as rapid thermal processing, annealing, and oxidation, may be performed in the thermal processing chamber with improved results. The combined use of infrared and UV radiation enables surface selective reactions which is not possible by using either radiation alone.

Figure 1:
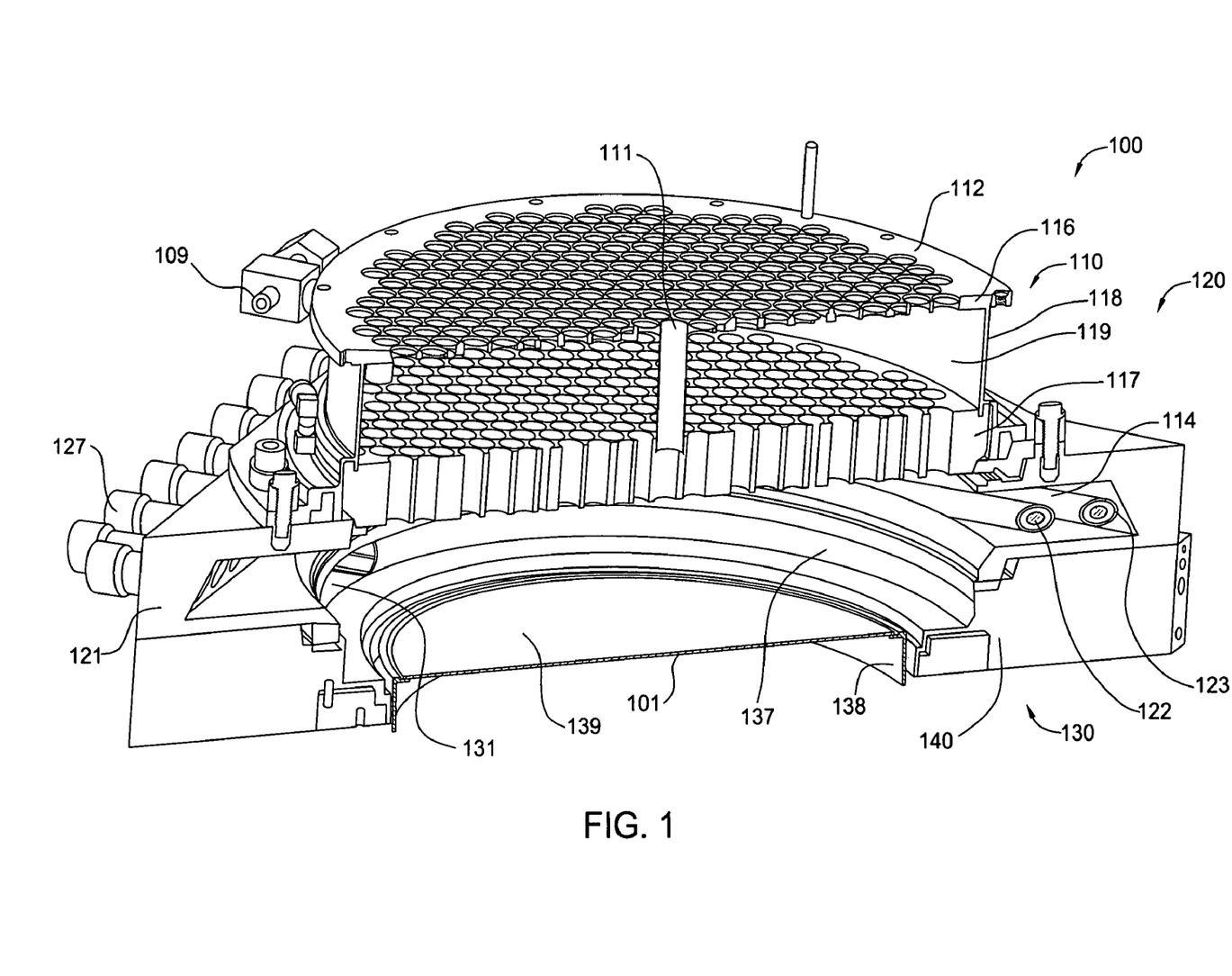
FIG. 1 illustrates a sectional perspective view of a thermal processing chamber in accordance with one embodiment of the present invention.

FIG. 1 illustrates a sectional perspective view of a thermal processing chamber 100 in accordance with one embodiment of the present invention. The thermal processing chamber 100 generally comprises a lamp assembly 110, and a chamber 130 having a UV assembly 120 disposed therein. In one embodiment, the chamber 130 is a vacuum chamber. In another embodiment, the chamber 130 may be an atmospheric chamber. The lamp assembly 110 is positioned above the chamber 130 and configured to supply heat to the chamber 130 via a quartz window 114 of the chamber 130. The lamp assembly 110 is configured to house a heating source, such as a plurality of tungsten-halogen lamps configured to provide a tailored infrared heating means to a substrate 101 disposed in the chamber 130. The UV assembly 120 is configured to provide a UV source to the chamber 130, for example to generate active species for reaction on the surface of the substrate 101 in the chamber 130.

The lamp assembly 110 generally comprises a radiant energy pipe assembly 112 having a plurality of light pipes 111. The light pipes 111 may be made of stainless steel, brass, aluminum or other metal. Each of the light pipes 111 is configured to house a radiant energy source, for example a tungsten-halogen lamp. The ends of the light pipes 111 are brazed or welded to openings in an upper cooling wall 116 and a lower cooling wall 117. A cylindrical wall 118 is brazed or welded to the peripheral edge of the upper cooling wall 116 and the lower cooling wall 117. In one embodiment, the light pipes 111 may be disposed in a hexagonal arrangement. Coolant may be circulated to the lamp assembly 110 through an inlet 109 to cool the light pipes 111 and to keep to walls 116, 117 and 118 cool during process.

The chamber 130 generally comprises a circular sidewall 140 defining a chamber volume 139 with the quartz window 114 and a bottom wall (not shown). The sidewall 140 may have an inlet 131 and an outlet (not shown) configured to connect the chamber volume 139 with a gas source and a pump. A silt valve may be adapted to an opening 137 on the sidewall 140 for a robot to drop/retrieve the substrate 101 on/from a substrate support 138 positioned in the chamber volume 139. The substrate support 138 may be configured to move vertically and to rotate about a central axis.

Figure 2:
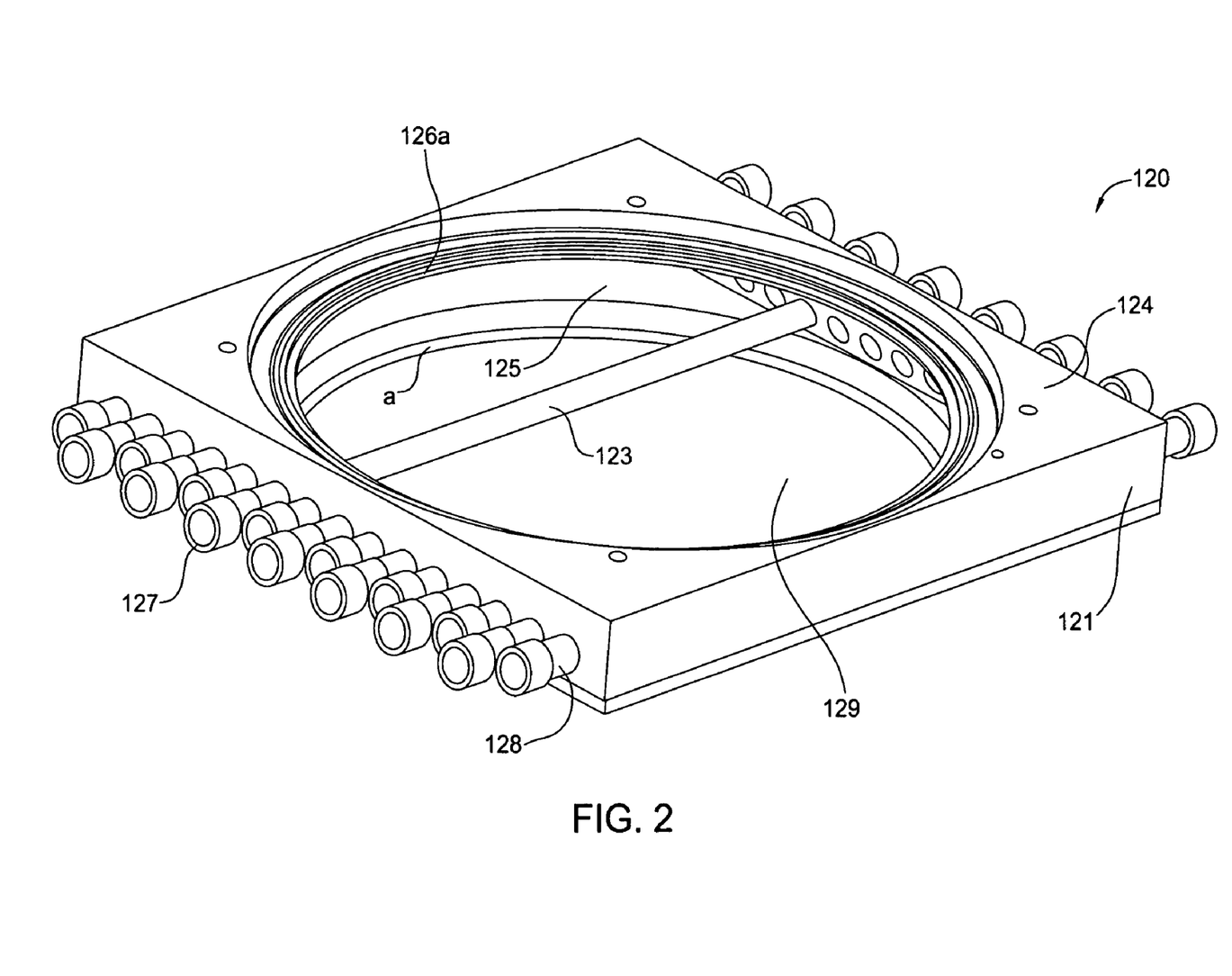
FIG. 2 illustrates a perspective view of a UV (ultra violet) assembly in accordance with one embodiment of the present invention.

The UV assembly 120 is generally disposed on an upper portion of the chamber volume 139. In one embodiment, the UV assembly 120 may take form of a module which may be "plugged in" to the chamber 130. Different designs of UV assemblies may be exchangeably plugged into the chamber 130 to suit different design recipes. FIG. 2 illustrates a perspective view of the UV assembly 120 used in the thermal processing chamber 100 of FIG. 1. The UV assembly 120 generally comprises a top 124, a bottom 125 and sidewalls 121, which defines a UV volume 129 therein. An opening 126b on the bottom 125 is configured to connect the UV volume 129 with the chamber volume 139 of the chamber 130 shown in FIG. 1. An opening 126a on the top 124 exposes the UV volume 129 to the quartz window 114 of FIG. 114, hence providing a passage for the radiation energy from the lamp assembly 110 to the chamber volume 139 during process.

The UV assembly 120 further comprises a plurality of quartz tubes 123 with both ends extending out of opposing sidewalls 121 of the UV assembly 120. On each end of the quartz tubes 123, a removable cap 127 may be used for sealing. Each of the quartz tubes 123 is configured to house a UV lamp 122 (shown in FIG. 1) therein.

The UV lamps 122 may include sealed plasma bulbs filled with one or more gases such as xenon (Xe) or mercury (Hg) for excitation by a power source. In one embodiment, the power source may be a conventional UV power source or one or more transformers to include energize filaments of the magnetrons. In another embodiment, the power source can introduce radio frequency (RF) energy sources that are capable of excitation of the gases within the UV lamp bulbs. In one embodiment, the UV lamp bulb may have low pressure Hg or other low pressure UV producing discharges to produce radiation of 254 nm and 185 nm.

In one embodiment, the UV lamp 122 may be positioned in one of the quartz tubes 123 such that electrodes of UV lamps 122 protrude outside the UV volume 129, or at least are sheltered by the top 124 from the radiation energy of the lamp assembly 110 to keep the electrodes from overheating and to control the pressure in the UV lamp 122.

Figure 3:
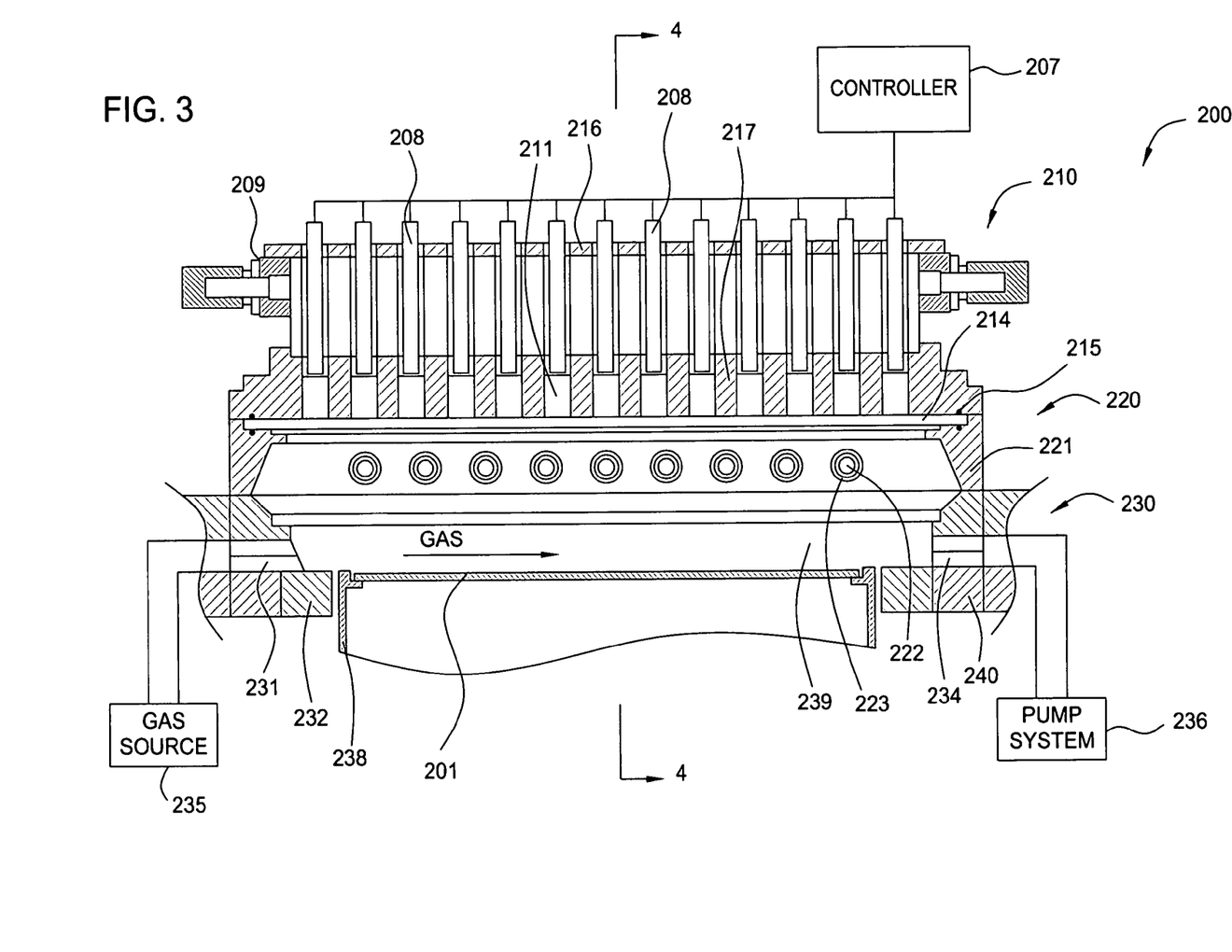
FIG. 3 illustrates a sectional view of a thermal processing chamber in accordance with one embodiment of the present invention.
Figure 4:
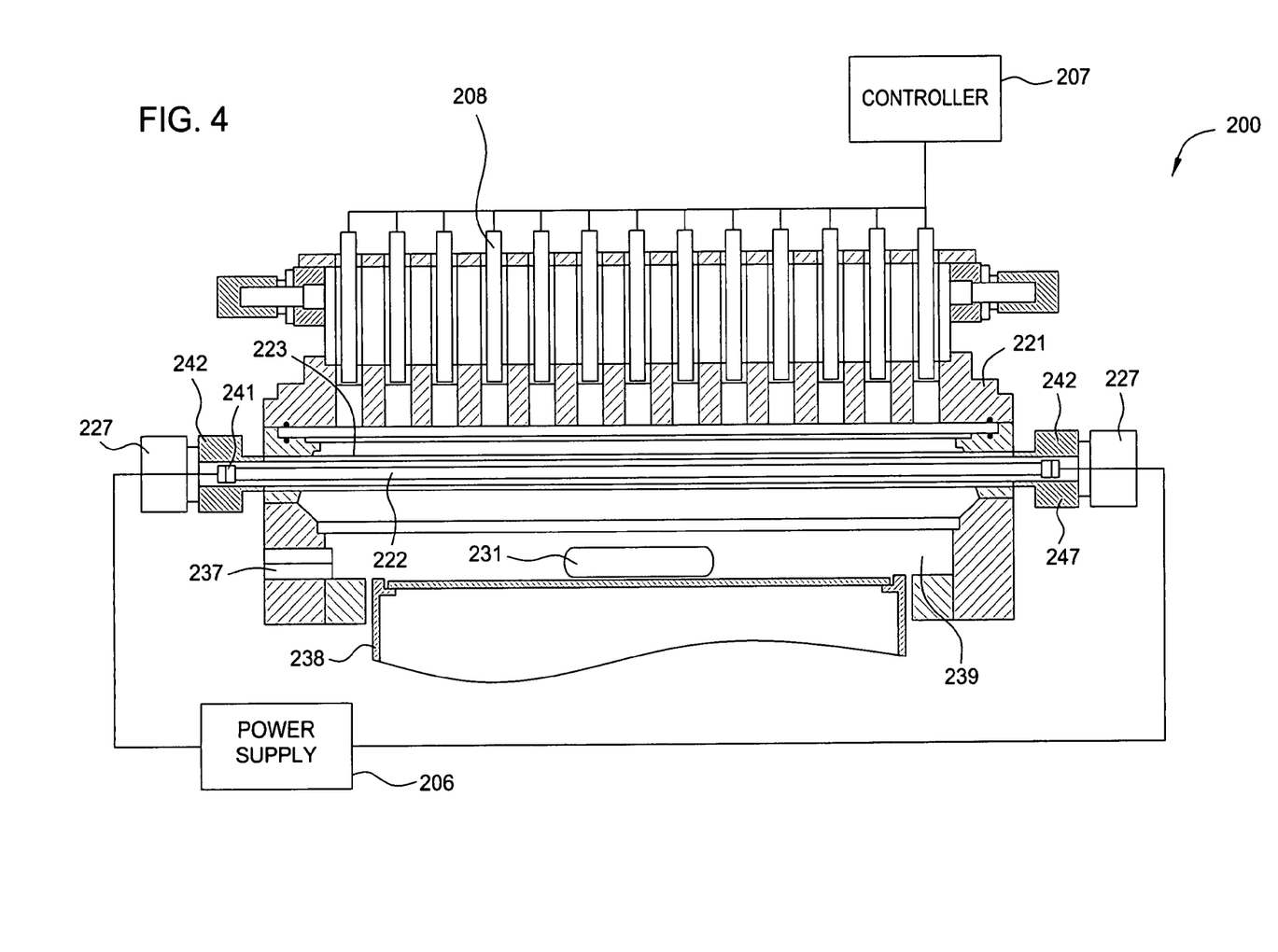
FIG. 4 illustrates a sectional view of the thermal processing chamber of FIG. 3.

FIG. 3 illustrates a sectional view of a thermal processing chamber 200 in accordance with one embodiment of the present invention. FIG. 4 illustrates a sectional view of the thermal processing chamber 200 of FIG. 3 along 4-4. The thermal processing chamber 200 generally comprises a lamp assembly 210, and a chamber 230 having a UV assembly 220 disposed therein. The lamp assembly 210 is positioned above the chamber 230 and configured to supply heat to the chamber 230 via a quartz window 214 of the chamber 230. The lamp assembly 210 is configured to house a heating source, such as a plurality of tungsten-halogen lamps configured to provide a tailored infrared heating means to a substrate 201 disposed in the chamber 230. The UV unit is configured to provide a UV source to the chamber 230, for example to generate active species for reaction on the surface of the substrate 201 in the chamber 230.

The lamp assembly 210 generally comprises a plurality of light pipes 211. The light pipes 211 may be made of stainless steel, brass, aluminum or other metal. Each of the light pipes 211 is configured to house a radiant energy source 208, for example a tungsten-halogen lamp to provide heat to the chamber volume 239 in form of infrared radiation. The ends of the light pipes 211 are brazed or welded to openings in an upper cooling wall 216 and a lower cooling wall 217. A cylindrical wall 218 is brazed or welded to the peripheral edge of the upper cooling wall 216 and the lower cooling wall 217. In one embodiment, the light pipes 211 may be disposed in a hexagonal arrangement. Coolant may be circulated to the lamp assembly 210 through an inlet 209 to keep to walls cool during process. Each of the radiant energy source 208 may be connected to a controller 207 which may control the energy level of each radiant energy source 208 to achieve a uniform or tailored heating profile to the chamber volume 239. In one embodiment, the radiant energy sources 208 may be grouped in a plurality of radial bands. In another embodiment, the radiant energy sources 208 may be controlled individually.

The chamber 230 generally comprises a circular sidewall 240 defining a chamber volume 239 with the quartz window 214 and a bottom wall (not shown). The sidewall 240 may have an inlet 231 adapted to a gas source 235 configured to provide one or more gases to the chamber volume 239. An outlet 234, generally disposed on an opposite side of the sidewall 240 of the inlet 231, is adapted to a pump 236. A silt valve (not shown) may be adapted to an opening 237 (shown in FIG. 4) on the sidewall 240 for a robot to drop/retrieve the substrate 201 on/from a substrate support 238 positioned in the chamber volume 239. The substrate support 238 may be configured to move vertically and to rotate about a central axis.

The UV assembly 220 is generally disposed on an upper portion of the chamber volume 239. In one embodiment, the UV assembly 220 may take the form of a module which may be "plugged in" to the chamber 230. The UV assembly 220 may be similar to the UV assembly of FIG. 2. A plurality of quartz tubes 223 may be disposed in a parallel manner with both ends extending out of opposing sidewalls 221 of the UV assembly 220. In one embodiment, the UV assembly 220 may include about 15 quartz tubes 223 evenly distributed on a horizontal plane. A UV lamp 222 may be disposed in each of the quartz tubes 223 to provide a desired UV resource. By using the quartz tubes 223 to enclose the UV lamps 222, particle contamination or other damage to the chamber 230 as a result of a broken UV lamp 222 may be prevented. Referring to FIG. 4, each of the plurality of quartz tubes 223 protrudes out of the sidewalls 221. The UV lamp 222 inside each quart tube 223 is placed such that two electrodes 241 of the UV lamp 222 are outside the chamber volume 239. The electrodes 241 are adapted to a power supply 206 configured to provide an energy source to each of the UV lamps 222 independently. Caps 227 may be used to close the quartz tubes 223. Seals 242 may be used near the interface of each quartz tube 223 and the sidewall 221 to seal the chamber volume 239.

The UV assembly 220 and the lamp assembly 210 may be used alone or in combination to supply heat, activate surface sites, or create active species inside the chamber 230. A plurality of processes, such as rapid thermal processing, annealing, and oxidation, may be performed in the thermal processing chamber 200.

During an oxidation process, the lamp assembly 210 may be used to provide heat in form of infrared radiation to the substrate 201 disposed in the chamber volume 239. In one embodiment, the lamp assembly 210 may be adjusted to rapidly heat the substrate 201 uniformly to a temperature that enables diffusion of oxygen through the silicon dioxide product layer in the substrate 201. The UV assembly 220 may be used to provide UV radiation generate active species from precursors supplied to the chamber volume 239 through the inlet 231. It should be noted that the pressure inside the UV lamps 222 are low enough, the UV lamps 222 would absorb very limited amounted of radiation energy from the lamp assembly 210 even though the UV lamps 222 are positioned in the radiation path of the lamp assembly 210. The quartz tubes 223 may absorb some radiation energy from the lamp assembly 210. In one embodiment, the quartz tubes 223 may have rectangular cross sections to minimize the disturbance to the radiant energy profile from the lamp assembly 210.

The UV radiation from the UV assembly 220 may be used to irradiate precursor that is capable of generating desired active species for treating a film on the substrate. For examples, the precursors may comprises or consist of nitrogen, oxygen, or fluorine. However, other active species and precursors may be used. The UV radiation source may be tailored to generate different active species. In one embodiment, tailoring the UV radiation source may be achieved by adjusting the gas pressure inside a UV lamp bulb to emit UV radiation of different wavelength.

In one embodiment, UV radiation may be used to create highly reactive oxidant species near a reactive surface from oxygen ($O_2$), ozone ($O_3$), nitrous oxide ($N_2O$), carbon monoxide (CO), carbon dioxide ($CO_2$), water ($H_2O$), or combinations thereof in a thermal processing chamber having an infrared radiation source to heat the reactive surface, such as the thermal processing chamber 200 of FIG. 3.

In another embodiment, UV radiation may be used to create highly reactive nitridation species near a reactive surface from ammonia ($NH_3$), nitrogen gas ($N_2$), hydrazines, amines, or combinations thereof in a thermal processing chamber having an infrared radiation source to heat the reactive surface, such as the thermal processing chamber 200 of FIG. 3.

In another embodiment, UV radiation may be used to create highly reactive oxidation/nitridation species near a reactive surface from nitrous oxide or nitric oxide in a thermal processing chamber having an infrared radiation source to heat the reactive surface, such as the thermal processing chamber 200 of FIG. 3.

In another embodiment, UV radiation may be used to create highly reactive fluorinate species near a reactive surface from $NF_3$, $F2$, $CF_4$, $SF_6$, $C_2F_6$, $CCl_4$, $C_2Cl_6$, or combinations thereof in a thermal processing chamber having an infrared radiation source to heat the reactive surface, such as the thermal processing chamber 200 of FIG. 3. When using UV radiation energy to generate reactive fluorinate species, the quartz tubes 223 may be replaced by tubes made from fluorinate resistive materials.

The combined use of infrared and UV radiation enables surface selective reactions which are not possible by using either radiation alone. In one aspect, surface selective reactions may be achieved by combining UV activation and differential surface heating as a result of engineered emissivity differences.

There are several advantages of this configuration of a thermal processing chamber with both UV radiation source and infrared radiation source. In one aspect, using both UV and infrared radiation on some processes, such as oxidation, may shorten the process time because the temperature raise of the substrate may be decreased by using the UV radiation to generate active species instead of using the infrared radiation to generate active species.

In another aspect, the independent controls of the UV radiation source and infrared radiation source enhance uniformity of process results. More particularly, the infrared radiation source, such as the lamp assembly 210 of FIG. 3, enables rapid flexible substrate temperature control by tailored infrared radiation distribution, while the UV radiation source, such as the UV assembly 220 of FIG. 3, enables the independent tailored UV distribution for active species and active site generation.

In another aspect, the configuration of positioning UV radiation source within the infrared radiation region enables better optimization of the uniformity of both radiation types on the substrate processing surface and in the gas phase in the chamber.

Additionally, by using the UV radiation inside the chamber to irradiate the gas phase, this configuration creates active species in the vicinity of the substrate surface enabling creation of very active species close to the location of use and minimizing the loss by recombination or other undesired reactions.

Further, this configuration also has advantages in retarding loss of volatile materials from the substrate surface because this configuration enables creation of active species at higher pressure than state of the art method, such as using plasmas. The loss of volatile materials from the substrate surface is generally undesirable since it leads to loss of desired surface features, to condensate fouling of optical surfaces, and to particle generations. Higher pressures are often useful in retarding loss of volatile materials from the substrate surface. However, in the state of art methods from creating active species, such as plasmas, generally require low total gas pressures to permit the escape of the active species outside the ionized region of the plasma while keeping the substrate outside the ionized region. High density plasmas often have contamination issues traceable to material exposure to very high temperature which is often the case for high thermal processing.

Furthermore, the use of UV radiation to irradiate both the substrate surface and the gas phase may lead to enhanced kinetics from simultaneous creation of activated sites and activated species.

Figure 5:
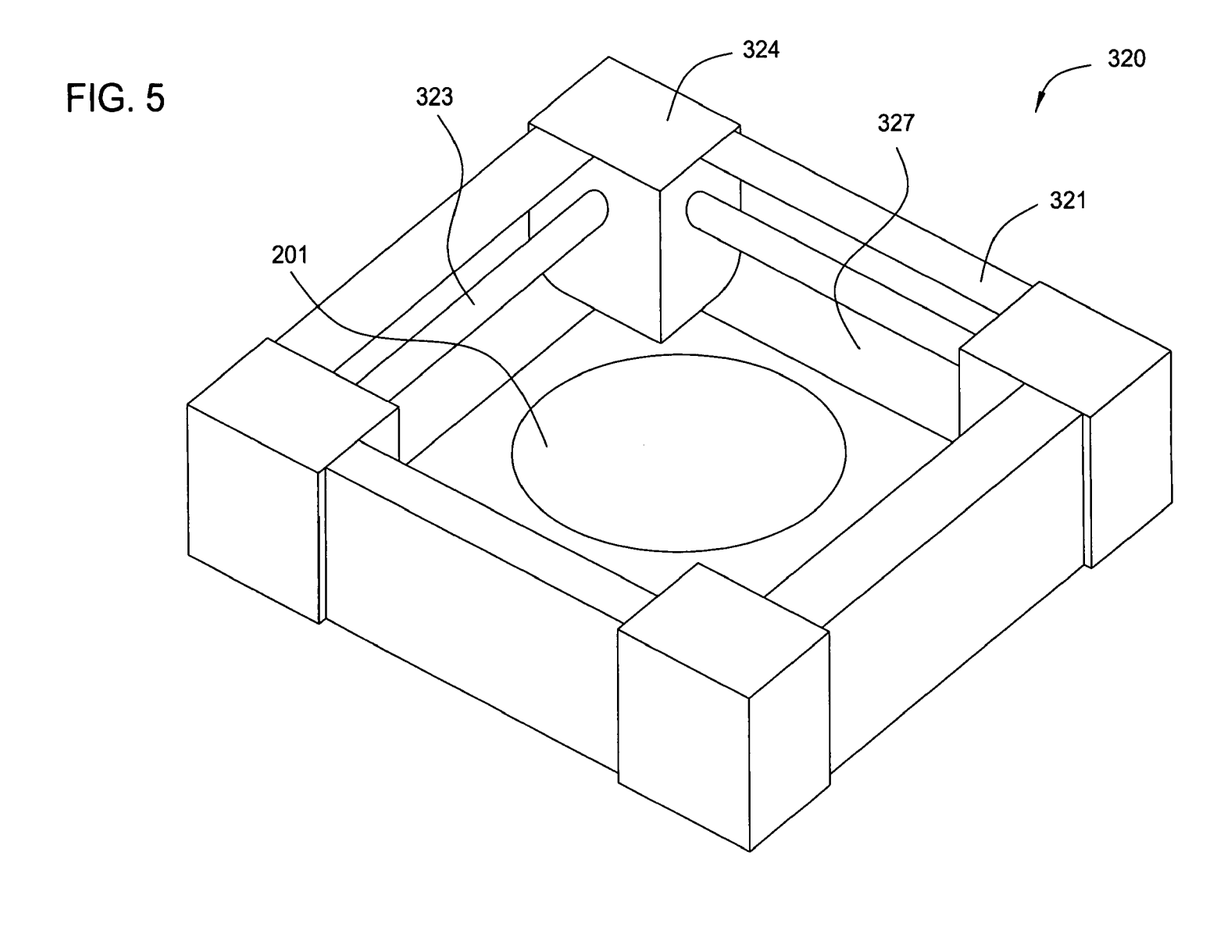
FIG. 5 illustrates a perspective view of a UV assembly in accordance with one embodiment of the present invention.

FIG. 5 illustrates a perspective view of a UV assembly 320 in accordance with another embodiment of the present invention. The UV assembly 320 may be used to provide UV radiation to a thermal processing chamber, such as the thermal processing chamber 100 of FIG. 1 and 200 of FIG. 3. The UV assembly 320 generally comprises a plurality of sidewalls 321 joint by a plurality of joints 324 to form a polygon. In one embodiment, the polygon is a square, as shown in FIG. 5. A UV lamp 322 enclosed in a quartz tube 323 is generally disposed inside each of the plurality of sidewalls 321. Each of the UV lamps 322 and the quartz tubes 323 extend into two neighboring joints 324 wherein electrodes of the UV lamps 322 may be shielded from any radiation inside the chamber the UV assembly 320 resides. This configuration directs the UV radiation energy more towards the gas phase and less towards the substrate surface. Single ended UV lamps, such as XERADEX® lamp may be used in this configuration.

Figure 6:
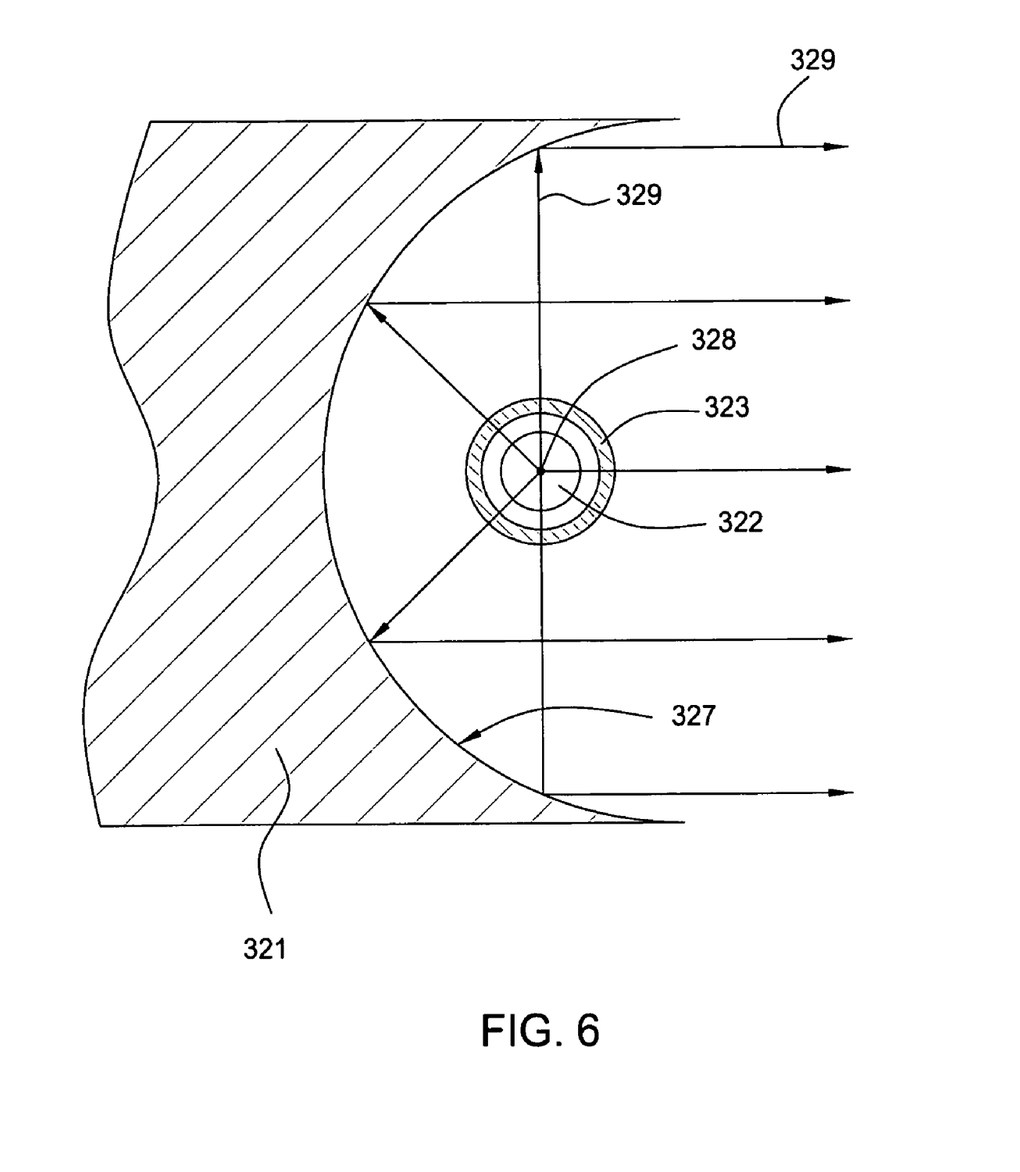
FIG. 6 illustrates a sectional view of an exemplary reflector used in the UV assembly of FIG. 5.

A plurality of reflectors 327 is generally positioned along each of the plurality of sidewalls 321 to reflect UV radiation from the corresponding UV lamp 322 in a desired way. The reflectors 327 generally have a designed sectional shape to achieve a desirable function. In one embodiment, as shown in FIG. 6, the sectional shape of each of the reflectors 327 is a parabolic curve. The center of the corresponding UV lamp 322 is disposed at a focus 328 of the parabolic curve. When radiation rays 329 from the UV lamp 322 reach the reflector 327, the reflector 327 reflects the radiation rays 329 to inside the polygon formed by the UV lamps 322 and perhaps parallel to the substrate processing surface. The sectional shape of the reflectors 327 may also be elliptical or other types. The reflectors 327 may have a reflecting surface made from metal, such as aluminum or silver, or from a stack of dielectric films that effectively reflects UV radiation. The use of reflectors 327 may be used to minimize UV exposure on the surface of the substrate being processed. In one embodiment, the reflectors 327 may also be used as microwave cavities for UV lamps powered by microwave power source.

Figure 7:
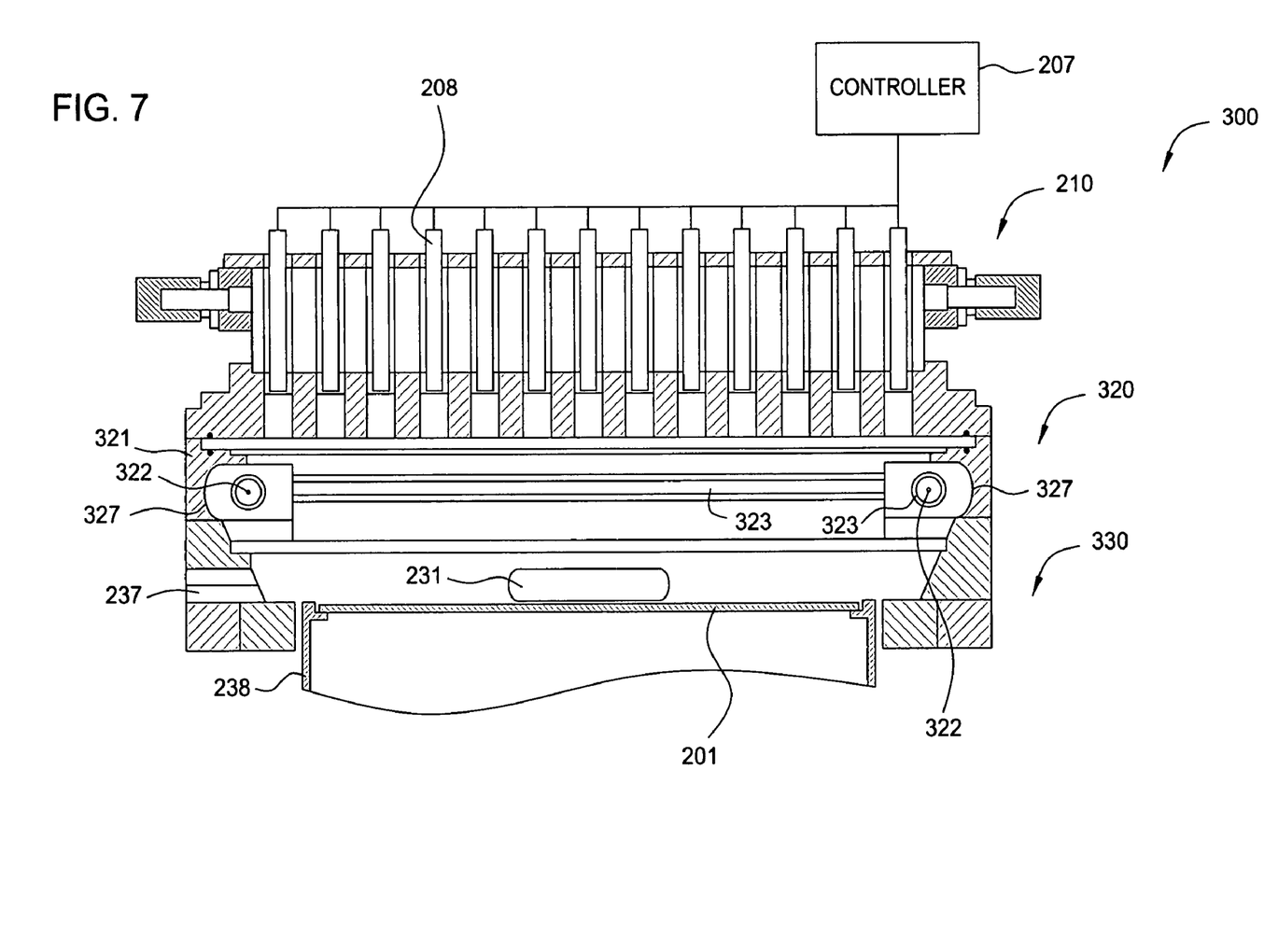
FIG. 7 illustrates a sectional view of a thermal processing chamber having a UV assembly of FIG. 5.

FIG. 7 illustrates a sectional view of a thermal processing chamber 300 having the UV assembly 320 of FIG. 5. The thermal processing chamber 300 is similar to the thermal processing chamber 200 of FIG. 3 except the UV assembly 220 is replaced by the UV assembly 320. As shown in FIG. 7, the UV lamps 322 are outside the radiation region of the lamp assembly 210. This configuration minimizes the UV radiation on the substrate 201 and the energy absorption of by the quartz tubes 323 during process.

While the foregoing is directed to embodiments of the present invention, other and further embodiments of the invention may be devised without departing from the basic scope thereof, and the scope thereof is determined by the claims that follow.

What is claimed is:

1. An apparatus for thermal processing a substrate, comprising:
    a chamber;
    a UV radiation assembly disposed inside the chamber; and
    an outside radiation assembly configured to radiate energy into the chamber through a quartz window on the chamber.

2. The apparatus of claim 1, wherein the outside radiation assembly comprises a plurality of infrared radiation sources arranged in a hexagonal arrangement.

3. The apparatus of claim 1, wherein the UV radiation assembly comprises a plurality of UV lamps.

4. The apparatus of claim 3, wherein each of the plurality of UV lamps is enclosed in a quartz pipe.

5. The apparatus of claim 3, wherein the plurality of UV lamps are parallel to one another and are evenly distributed above a processing surface of the substrate.

6. The apparatus of claim 3, wherein electrodes of the plurality of UV lamps are disposed outside the chamber.

7. The apparatus of claim 3, wherein the plurality of UV lamps are arranged along a polygon surrounding a processing surface of the substrate.

8. The apparatus of claim 7, wherein the UV radiation assembly further comprises a plurality of reflectors, and each of the plurality of reflectors is configured to reflect UV radiation from a corresponding UV lamp substantially parallel to the substrate.

9. The apparatus of claim 8, wherein the plurality of reflectors having a parabolic cross section with the corresponding UV lamp positioned in a focus of the parabolic cross section.

10. An apparatus for thermal processing a substrate, comprising:
    a chamber having a top window;
    a substrate support mounted inside the chamber, wherein the substrate support is configured to support the substrate with a processing surface facing the top window;
    a first energy assembly disposed outside the chamber, wherein the first energy assembly is configured to radiate energy through the top window; and
    a second energy assembly mounted inside the chamber above the substrate support, wherein the second energy assembly is configured to provide ultra violet energy.

11. The apparatus of claim 10, wherein the second energy assembly comprises a plurality of UV lamps arranged parallel to one another.

12. The apparatus of claim 11, wherein each of the plurality of UV lamps is individually controllable.

13. The apparatus of claim 10, wherein the second energy assembly comprises a plurality of UV lamps arranged in a polygon surrounding the processing surface of the substrate.

14. The apparatus of claim 13, wherein the second energy assembly further comprises a plurality of reflectors, each of the plurality of reflectors is configured to reflect the UV radiation from a corresponding UV lamp substantially parallel to the processing surface of the substrate.

15. The apparatus of claim 10, wherein the first energy assembly comprises a plurality of lamps having a hexagonal arrangement.

16. The apparatus of claim 10, wherein the first energy assembly is configured to provide infrared energy.

17. A method for thermal processing a substrate, comprising:
    positioning the substrate in a chamber;
    supplying a precursor to the chamber;
    applying a first energy source to supply heat to the chamber; and
    applying a second energy source to generate active species from the precursor in the chamber near a surface of the substrate, wherein the first and second energy sources are applied in combination.

18. The method of claim 17, where the first energy source comprises a plurality of heating lamps and the second energy source comprises a plurality of UV lamps.

19. The method of claim 18, further comprising:
    positioning the first energy source outside a quartz window of the chamber; and
    positioning the second energy source inside the chamber.

20. The method of claim 17, wherein applying the second energy source comprises tailoring radiation distribution for active species generation.

* * * * *